United States Patent [19]

Shinohara

[11] Patent Number: 4,806,499
[45] Date of Patent: Feb. 21, 1989

[54] METHOD OF MANUFACTURING BI-CMOS SEMICONDUCTOR IC DEVICES USING DOPANT REDIFFUSION

[75] Inventor: Mamoru Shinohara, Tokyo, Japan

[73] Assignee: Oki Electric Industry Co., Ltd., Tokyo, Japan

[21] Appl. No.: 79,804

[22] Filed: Jul. 31, 1987

Related U.S. Application Data

[63] Continuation-in-part of Ser. No. 873,403, Jun. 12, 1986.

[30] Foreign Application Priority Data

Jun. 13, 1985 [JP] Japan .................. 60-127234

[51] Int. Cl.[4] .................. H01L 21/22; H01L 21/26; H01L 21/265
[52] U.S. Cl. .................. 437/31; 148/DIG. 9; 148/DIG. 31; 148/DIG. 38; 357/43; 357/88; 437/34; 437/57; 437/154; 437/164; 437/166; 437/240
[58] Field of Search .................. 148/DIG. 9, 10, 32, 148/38, 82, 161, 31; 437/29, 31, 34, 56, 59, 57, 76, 150, 153, 165, 238, 247, 154, 164, 240; 357/42, 43, 44, 48, 91, 54, 34, 88; 156/644, 643

[56] References Cited

U.S. PATENT DOCUMENTS

| | | | |
|---|---|---|---|
| 4,341,571 | 7/1982 | Hiss et al. | 437/34 |
| 4,346,512 | 8/1982 | Liang et al. | 437/29 |
| 4,362,574 | 12/1982 | Gevondyan | 437/31 |
| 4,475,279 | 10/1984 | Gahle | 357/91 |
| 4,497,106 | 2/1985 | Momma et al. | 357/43 |
| 4,503,603 | 3/1985 | Blossfeld | 357/91 |
| 4,505,766 | 3/1985 | Nagumo et al. | 357/48 |
| 4,509,250 | 4/1985 | Blossfeld | 437/31 |
| 4,512,815 | 4/1985 | Khadder | 357/43 |
| 4,521,448 | 6/1985 | Sasaki | 156/643 |
| 4,527,456 | 7/1985 | Anzai et al. | 437/59 |
| 4,550,490 | 11/1985 | Blossfeld | 437/31 |

OTHER PUBLICATIONS

Ghandhi, "VLSI Fabrication Principles", John Wiley & Sons, New York, N.Y., 1983, pp. 132-135.

Primary Examiner—Brian E. Hearn
Assistant Examiner—William Bunch
Attorney, Agent, or Firm—Wenderoth, Lind & Ponack

[57] ABSTRACT

The invention relates to a method of manufacturing a Bi-CMOS semiconductor IC device in which the bipolar transistor structure contained therein has a flat PN plane junction between its base and emitter regions, said device having improved breakdown voltage characteristics.

The improved method involves preparing a silicon substrate having a P-type base region formed in an N-type collector region, forming a thick silicon oxide layer over the suface of a bipolar transistor region on said substrate, selectively removing the silicon oxide layer to form a first window exposing a part of the collector region and a second window exposing a part of the base region, diffusing phosporus atoms into the base region and collector region through said first and second windows to form an emitter region in the base region and a collector contact in the collector region, subjecting the structure thus-obtained to an oxidation process in a wet oxygen atmosphere at a temperature of 940° C.±20° C. to form a thin silicon oxide layer in the windows, whereby the thin oxide layer on the emitter region invades the emitter region to accomodate the phosphorus atoms, selectively removing a portion of the thin oxide film to form a third window, thereby exposing a surface of the emitter region and subjecting the structure thus-obtained to an impurity drive-in process to rediffuse the phosphorus atoms contained in the remaining thin oxide film into the emitter region, whereby the PN junction plane between the base and emitter regions is flattened. Other variations of this general method are disclosed.

4 Claims, 4 Drawing Sheets

METHOD OF MANUFACTURING BI-CMOS SEMICONDUCTOR IC DEVICES USING DOPANT REDIFFUSION

CROSS REFERENCE TO RELATED APPLICATION

This is a continuation-in-part of U.S. application Ser. No. 873,403, filed June 12, 1986.

BACKGROUND OF THE INVENTION

1. Field of the Invention

The present invention relates to a method of manufacturing a semiconductor integrated circuit (IC) device, and more particularly to a Bi-CMOS semiconductor IC device including bipolar transistors and MOS FETs.

2. Description of the Prior Art

Prior art methods of manufacturing Bi-CMOS IC devices are disclosed, for example, in the paper entitled "Dependency on A Surface Oxide Film to Phosphorus Diffusion" in the preliminary reports (Lecture No. 416) of the Fifth Scientific Lecture Meeting of the Society of Japanese Applied Physics, in autumn 1984, and in the paper entitled "A Gate Oxidation Effect on Bipolar elements by a Bi-CMOS Process" in a separate volume 1, Part 90 of the lecture papers at the National Meeting in a Communication Section of the Society of Electronic Communication held in 1984.

As shown in FIG. 3, it is desirable that the bipolar transistor region of a Bi-CMOS IC device has a flat PN junction between its emitter and base regions 5A and 6A in an epitaxial layer over a P-type silicon substrate 10 to obtain a controlled transconductance hFE.

In a conventional Bi-CMOS IC process, a thick oxide layer formed on the surface of a silicon substrate is selectively removed to form contact windows to the base and emitter regions, and then a thin oxide layer is formed in the windows. If the thick oxide layer is formed through a single photolithographic process, it tends to be horizontally eaten during an etching process, whereby the window obtained is degraded in the accuracy of its dimensions. For this reason, two different photolithographic steps are generally performed to form windows having a slow sloped wall in the thick oxide layer which can provide good step coverage for wiring layers.

For example, in order to form a sloped window, a thick silicon oxide layer formed over a silicon substrate is selectively removed to form a larger window exposing a surface of a diffused region, and then a thin silicon oxide layer (ex. gate oxide layer) is formed in the larger window. Next, the thin silicon oxide layer is selectively removed to form a smaller window for electrical contact in the larger window.

However, the additional oxidation process after the formation of the larger window will deeply rediffuse the impurities in the emitter region into the base region due to the accelerated diffusion effect of the thin silicon oxide layer formed on the surface of the emitter region in the larger window.

As a result, as shown in FIGS. 4 and 5, a protruded or recessed PN junction plane is formed between the base region 5A and the emitter region 6A over the silicon substrate 10. This has made it difficult to obtain a bipolar transistor region having a controlled transconductance $h_{FE}$ and higher breakdown voltage characteristics between the base and emitter regions.

SUMMARY OF THE INVENTION

It is an object of the present invention to provide an improved method of manufacturing a Bi-CMOS semiconductor IC device capable of eliminating the accelerated diffusion effect due to additional oxide growing steps, and forming dimensionally accurately contact windows.

It is another object of the present invention to provide a method of manufacturing a Bi-CMOS semiconductor IC device in which the bipolar transistor structure has a flat PN junction plane between its base and emitter regions.

It is still another object of the present invention to provide a method of manufacturing a Bi-CMOS semiconductor IC device in which a bipolar transistor structure has improved breakdown voltage characteristics.

The improved method according to the present invention comprises the steps of preparing a silicon substrate having a P type base region formed in an N-type collector region; forming a thick silicon oxide layer over the surface of a bipolar transistor region; selectively removing the silicon oxide layer to form a first window exposing a part of the collector region and a second window exposing a part of the base region; diffusing phosphorus atoms into the base region and the collector region through the first and second windows to form an emitter region in the base region and a collector contact in the collector region; subjecting the structure obtained by the previous step to an oxidation process in a wet oxygen atmosphere of 940° C.±20° C. to form a thin silicon oxide layer in the windows, whereby the thin oxide layer on the emitter region invades the emitter region to accommodate the phosphorus atoms; selectively removing a portion of the thin oxide film to form a third window exposing a surface of the emitter region; and subjecting the structure obtained by the previous step to an impurity drive-in process to rediffuse the phosphorus atoms contained in the remaining thin oxide film into the emitter region, whereby the PN junction plane between the base and emitter regions is flattened.

Another improved method according to the present invention comprises the steps of preparing a silicon substrate of P conductivity type having an epitaxial layer of an N conductivity type thereon, said epitaxial layer having a first region and a second region electrically isolated from the first region, the first region having a P well region, a P-type source region and a P-type drain region, the second region having a P-type base region formed in the epitaxial layer; forming a thermally grown thick silicon oxide layer on the surface of the structure obtained by the previous step; selectively removing the thick silicon oxide layer to form first and second windows exposing a surface of the P well region, a third window exposing a surface of the epitaxial layer in the second region, and a fourth window exposing a surface of the base region; diffusing phosphorus atoms into the epitaxial layer and the base region through the first, second, third and fourth windows to form an N-type source region and an N-type drain region in the P well region, and an emitter region in the base region; oxidizing the structure obtained by the previous step in a wet oxygen atmosphere at a temperature of 940°±20° C. to form thin silicon oxide layers in the windows, whereby the thin oxide film invades the emitter region to contain the phosphorus atoms therein; selectively removing the thin silicon oxide layer and the thick silicon oxide layer to form a fifth window exposing a surface of the P well between the N-type source and drain regions, a sixth window exposing a surface of the epitaxial layer between the P-type source and drain regions, and a seventh window exposing a surface of the emitter region; and subjecting the structure obtained by the previous step to an impurity drive-in process to form gate oxide layers in the fifth and sixth windows and to rediffuse the phosphorus atoms contained in the remaining thin oxide layer into the emitter region, whereby the PN junction plane between the base and emitter regions is flattened.

The above and other objects, features and advantages of the present invention will become more apparent from the following description when taken in conjunction with the accompanying drawings.

DESCRIPTION OF THE PREFERRED EMBODIMENTS

Figure 1A:
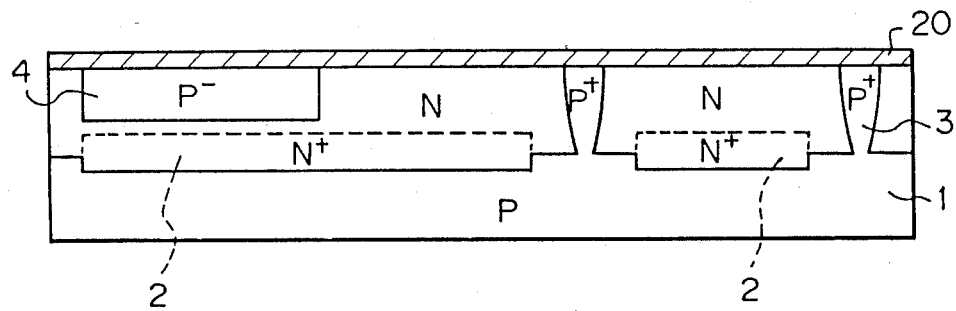
FIGS. 1(a) to 1(e) are cross sectional views illustrating the steps of manufacturing a Bi-CMOS semiconductor IC device according to the present invention.

An improved method of manufacturing a Bi-CMOS integrated circuit device according to the present invention will be explained in detail with reference to FIGS. 1(a) through 1(e).

First, a P-type <100> silicon substrate 1 having specific resistance of about 10 to 20 $\Omega$-cm is prepared as shown in FIG. 1 (a). The substrate 1 has N+ buried regions 2 formed by diffusing, for example, antimony atoms (Sb) into selected surfaces of the substrate. The substrate 1 also has an N-type epitaxial layer having a specific resistance of about 5 $\Omega$-cm, and having a thickness of about 10 $\mu$m on the surface thereof. Boron atoms are diffused in a selected portion of the epitaxial layer 2. Also, Boron atoms are implanted at an impurity concentration of about $1 \times 10^{13}$ atoms/cm$^2$ in a surface of the epitaxial layer in a CMOS device region. After this, the substrate is subjected to a thermal process at 1200° C. for about 9 hours to drive boron atoms therein and to form a P− well region 4 and P+ isolation regions reaching the silicon substrate 1. The P− well region 4 will have a sheet resistance of about 10 $\Omega/\square$. At the same time, a thick oxide layer 20 having a thickness of about 5000 Å to 6000 Å is formed over the surface of the silicon substrate 1.

Figure 1B:
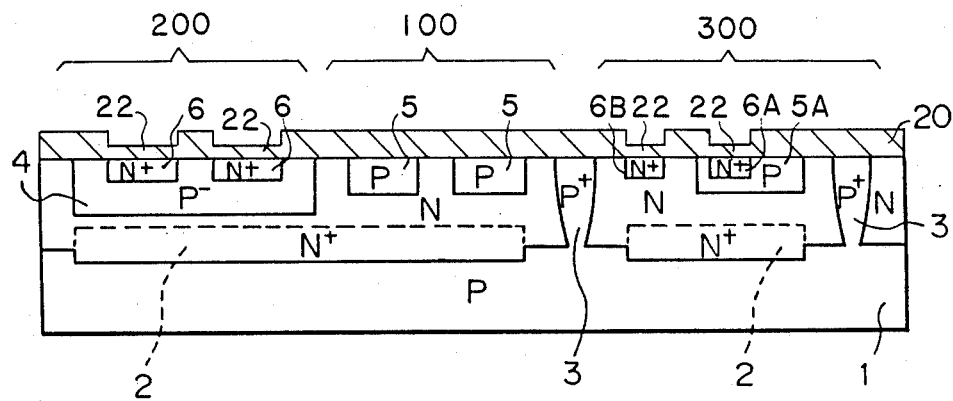

In FIG. 1(b), the thick silicon oxide layer 20 is selectively removed to form two windows exposing a surface of the epitaxial layer in a PMOS transistor region 100, and a window exposing a surface of a bipolar transistor region 300. Then, P-type source and drain regions 5 and a base region 5A are simultaneously formed by diffusing P type impurities into the epitaxial layer through the windows, and then a silicon oxide layer is formed in the windows by a thermal oxidation process. Next, the silicon oxide layer 20 is selectively removed to form windows exposing a surface of the P− well region 4, and windows exposing a surface of the bipolar transistor region. Phosphorus atoms are diffused into the P− well region 4 and the bipolar transistor region 300 through the windows, and then driven in under an atmosphere of wet oxygen at a temperature of 940° C.±20° C. for about 30 minutes to simultaneously form N-type source and drain regions 6 for an NMOS FET, an emitter region 6A, and a collector contact region 6B, while a silicon oxide layer 22 is grown in the windows.

Figure 1C:
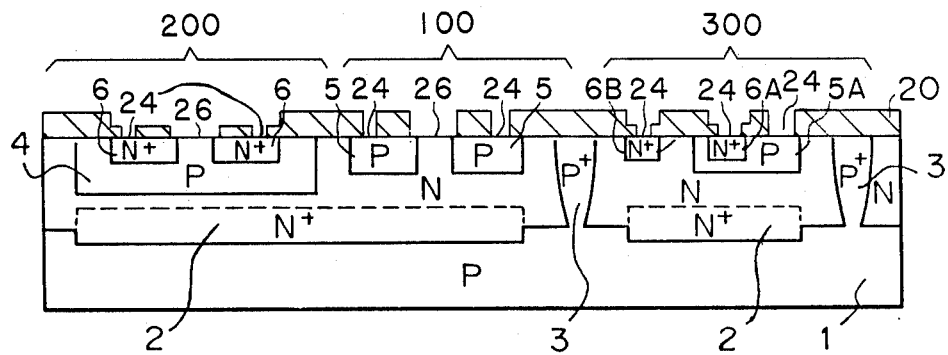

In the following step, as shown in FIG. 1(c), the silicon oxide layers 20 and 22 are selectively removed to form windows 24 and 26 for the formation of a gate insulating layer.

Figure 1D:
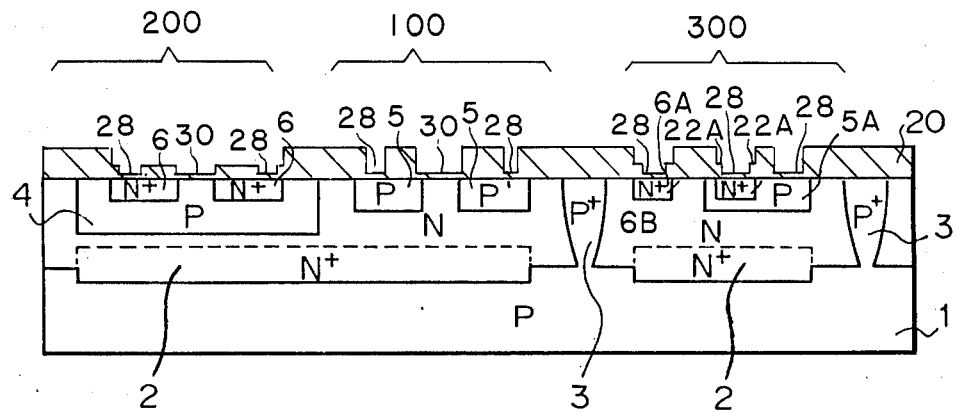
Figure 1E:
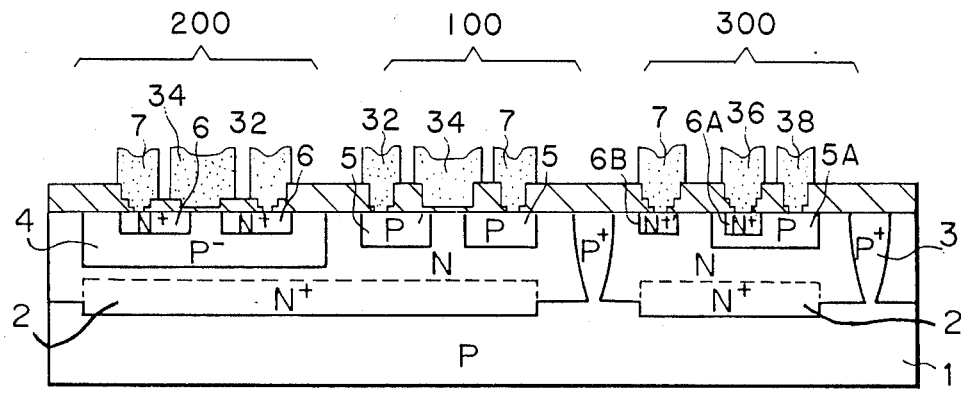

Next, the structure obtained by the previous step is subjected to an oxidation process under dry oxygen at about 1000° C. for 100 minutes to form a gate oxide layer 30 of about 1000 Å in thickness. At the same time, a thin silicon oxide layer 28 will be formed in the contact windows 24, as shown in FIG. 1(d). In this step, phosphorus atoms contained in the remaining thin oxide layer 22A will be rediffused into the emitter region 6A.

Then, as shown in FIG. 1 (e), the thin silicon oxide layers 28 are selectively removed to reform windows for electrical contacts to the diffused regions 5,5A,6,6A and 6B. Aluminum as a conductive material is deposited all over the surface of the obtained structure. The aluminum layer is selectively etched away to form source electrodes 7, drain electrodes 32, gate electrodes 34, a collector electrode 7, an emitter electrode 36, and a base electrode 38.

Figure 2:
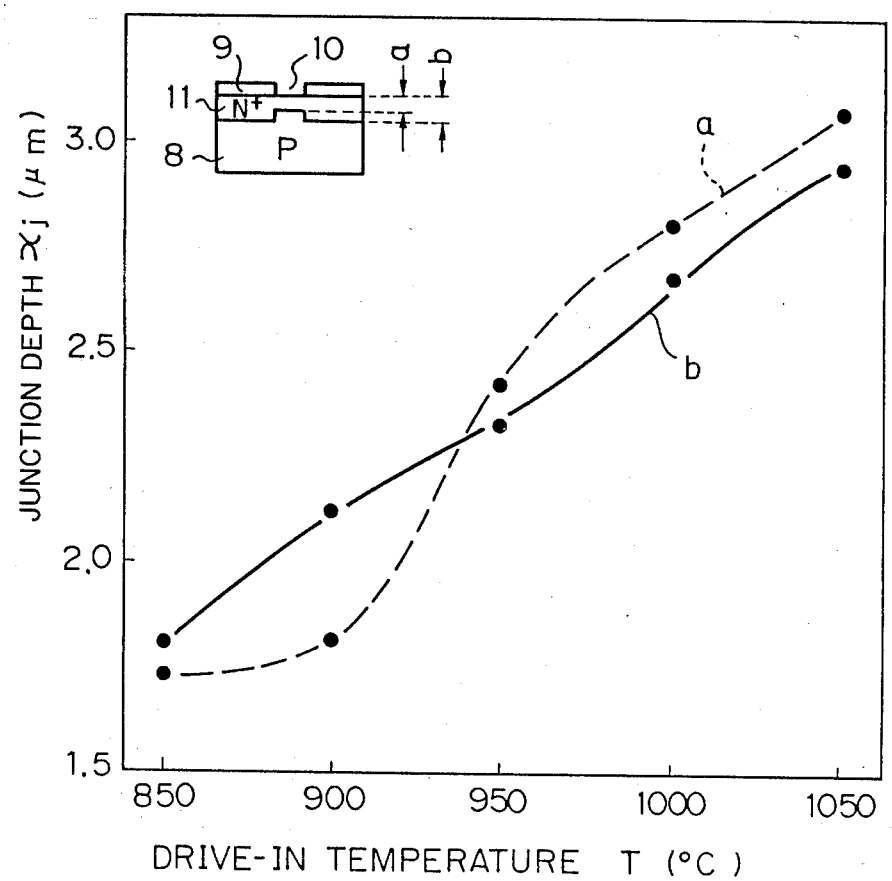
FIG. 2 is a graph showing the impurity drive-in temperature to the PN junction depth characteristics in a diffusion process.
Figure 3:
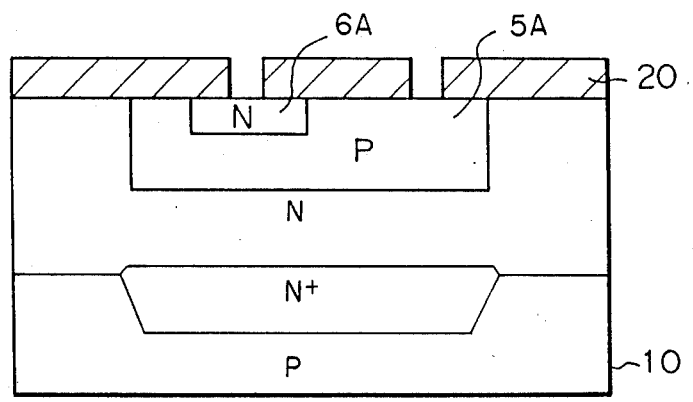
FIG. 3 is a cross sectional view of an ideal PN junction view formed between the emitter and base regions of an NPN transistor.
Figure 4:
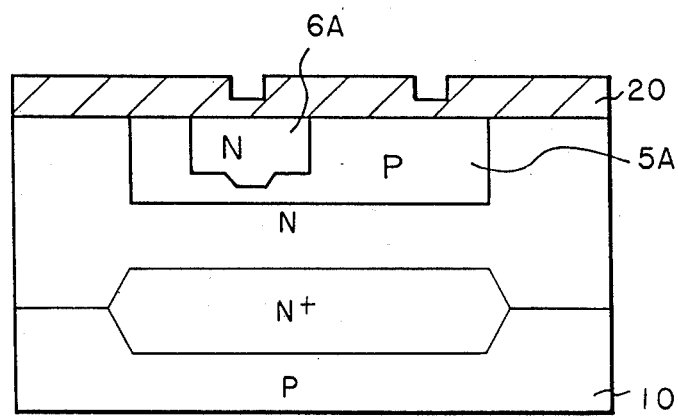
FIG. 4 is a cross sectional view of a prior art NPN transistor region having a protruded PN junction between emitter and base regions.
Figure 5:
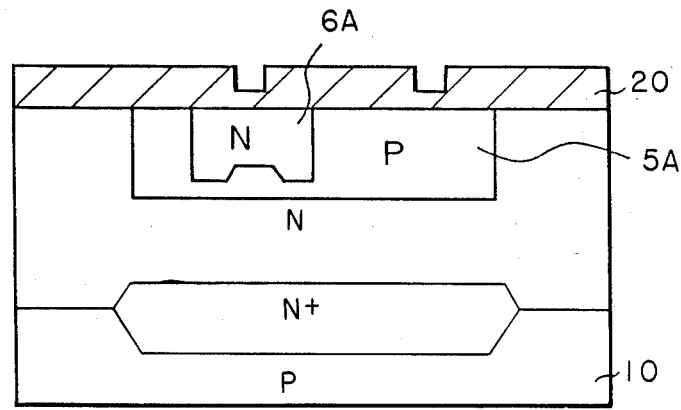
FIG. 5 is a cross sectional view of a prior art NPN transistor region having a recessed PN junction between its emitter and base regions.

As described above, it is very important to perform a drive-in process under a wet oxygen atmosphere of 940° C.±20° C. before the following thin (or gate) oxidation step. FIG. 2 shows the relationship between PN junction depth Xj and drive-in temperatures. In order to determine the improved process condition, as shown in FIG. 2, a P-type <100> silicon substrate 8 was used as a specimen, said substrate having a silicon oxide layer 9 thereon and a phosphorus doped region 11 therein. The specimen was subjected to a drive-in process under temperatures of from 850° C. to 1050° C., and then heated in a wet oxygen atmosphere of about 1000° C after the window 10 was formed in the silicon oxide layer 9. In this step, the diffused region 11 under the remaining silicon oxide layer 9 is rediffused to a depth a, while the diffused region under the window 10 to a depth b. This experiment proves that a drive-in temperature of more than about 940° C. results in the formation of a PN junction plan having a protruded portion. It is supposed that the phosphorus diffusion is accelerated under a window in the remaining silicon oxide layer during the following oxidation process. On the other hand, a drive-in temperature less than 940° C. results in the formation of a PN junction plane having a recessed portion. It is supposed that the phosphorus atoms contained in the remaining silicon oxide layer are rediffused during the following oxidation process. It is noted that a substantially flat PN junction plane is obtained at a temperature of about 940° C., as shown in FIG. 2. It will be practical to select a range of 940°±20° C. in the drive-in process to obtain good aftereffects.

As described above, in the process condition according to this invention, the rate that the phosphorus atoms diffused in the remaining silicon oxide layer are rediffused in the silicon substrate is substantially the same as that of phosphorus diffusion accelerated by the window effect during the additional oxidation process. This process condition leads to form a flat PN junction plane.

The method according to the present invention is particularly effective to a Bi-CMOS manufacturing process in which the formation of contact windows is required prior to the following oxidation process. Furthermore, a bipolar transistor element which has a flat PN junction plane between its emitter and base regions and an improved breakdown voltage characteristics between its base and emitter regions is obtained in the Bi-CMOS IC device.

Although a certain preferred embodiment have been shown and described, it should be understood that many changes and modifications may be made therein without departing from the scope of the appended claims.

I claim:

1. A method of manufacturing a Bi-CMOS semiconductors integrated circuit device including a bipolar transistor region in a silicon semiconductor substrate, comprising the steps of:
   (a) preparing a silicon substrate having a P-type base region formed in an N-type collector region;
   (b) forming a thick silicon oxide layer over the surface of said bipolar transistor region;
   (c) selectively removing said silicon oxide layer to form a first window exposing a part of said collector region and a second window exposing a part of said base region;
   (d) diffusing phosphorous atoms into said base region and said collector region through said first and second windows under a temperature of from 900° C. to 1000° C. to form an emitter region in said base region and a collector contact in said collector region;
   (e) subjecting the structure obtained by the step (d) to an oxidation process in a wet oxygen atmosphere of 940° C.±20° C. to form thin silicon oxide films in said windows, whereby said thin oxide film on said emitter region invades said emitter region to accommodate said phosphorous atoms;
   (f) selecting removing a portion of said thin oxide film to form a third window exposing a surface of said emitter region before a gate oxide layer is formed on said silicon substrate; and
   (g) subjecting the structure obtained by the step (f) to an impurity drive-in process to rediffuse said phosphorous atoms contained in the remaining thin oxide film into said emitter region, whereby the PN junction plane between said base and emitter regions is flattened.

2. A method according to claim 1, wherein said (g) is carried out under a temperature of at least 950° C.

3. A method of manufacturing a Bi-CMOS semiconductor integrated circuit device including bipolar transistors and P- and N-type MOS FETs form in a silicon semiconductor substrate, comprising the steps of:
   (a) preparing a silicon substrate of P conductivity type having an epitaxial layer having a first region and a second region electrically isolated from said first region, said first region having a P well region, a P-type source region and a P-type drain region, said second region having a P-type base region formed in said epitaxial layer;
   (b) forming a thermally grown thick silicon oxide layer on the surface of the structure obtained by the step (a);
   (c) selectively removing said thick silicon oxide layer to form first and second windows exposing a surface of said P well region, a third window exposing a surface of said epitaxial layer in said second region, and a fourth window exposing a surface of said base region;
   (d) diffusing phosphorous atoms into said epitaxial layer and said base region through said first, second, third and fourth windows under a temperature of from 900° C. to 1000° C. to form an N-type source region and an N-type drain region in said P well region, and an emitter region in said base region;
   (e) oxidizing the structure obtained by the step (d) in a wet oxygen atmosphere of temperature of 940° C.±20° C. to form think silicon oxide layers in said windows, whereby said thin oxide film invades said emitter region to contain said phosphorous atoms therein;
   (f) selectively removing said thin silicon oxide layer and said thick silicon oxide layer to form a fifth window exposing a surface of said P well between said N-type source and drain regions, a sixth window exposing a surface of said epitaxial layer between P-type source and drain regions, and a seventh window exposing a surface of said emitter region; and
   (g) subjecting the structure obtained by the step (f) to an impurity drive-in process to form gate oxide layers in said fifth and sixth windows to rediffuse said phosphorous atoms contained in the remaining thin oxide layer into said emitter region, whereby the PN junction plane between said base and emitter regions is flattened.

4. A method according to claim 3, wherein said step (g) is carried out under a temperature of at least 950° C.

* * * * *